(12) United States Patent
Thomas et al.

(10) Patent No.: US 7,023,097 B2
(45) Date of Patent: Apr. 4, 2006

(54) FBGA ARRANGEMENT

(75) Inventors: Jochen Thomas, Munich (DE);
Juergen Grafe, Dresden (DE); Ingo Wennemuth, Munich (DE); Minka Gospodinova-Daltcheva, Munich (DE);
Maksim Kuzmenka, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/927,952

(22) Filed: Aug. 27, 2004

(65) Prior Publication Data

US 2005/0098870 A1 May 12, 2005

(30) Foreign Application Priority Data

Aug. 27, 2003 (DE) ................. 103 39 770

(51) Int. Cl.
*H01L 23/48* (2006.01)

(52) U.S. Cl. ............ 257/780; 257/781; 257/784; 257/787; 257/738; 438/15; 438/19; 438/100; 438/106; 438/127

(58) Field of Classification Search .......... 257/780, 257/781, 700–703, 784, 786, 787, 705, 706–707; 438/15, 19, 100, 106, 127
See application file for complete search history.

(56) References Cited

U.S. PATENT DOCUMENTS

| 6,049,129 | A | 4/2000 | Yew et al. | |
|---|---|---|---|---|
| 6,218,731 | B1 | 4/2001 | Huang et al. | |
| 6,278,616 | B1 | 8/2001 | Gelsomini et al. | |
| 6,706,564 | B1 * | 3/2004 | Kim et al. ............. | 438/125 |
| 2003/0214047 | A1 * | 11/2003 | Noguchi .............. | 257/774 |

* cited by examiner

*Primary Examiner*—Jasmine Clark
(74) *Attorney, Agent, or Firm*—Slater & Matsil, L.L.P.

(57) ABSTRACT

The invention relates to an FBGA arrangement, comprising a substrate on which at least one chip is chip-bonded face-down, which has a central row of bonding pads connected to contact islands (landing pads) on the substrate by a bonding channel in the substrate via wire bridges, which substrate, for its part, is provided with soldering balls—arranged in an array—for contact connection to a printed circuit board, and the contact islands and the soldering balls being connected to one another via a rewiring of the substrate. The preferred embodiment of the invention is intended to provide an FBGA arrangement which supports the center pad row technology and at the same time has low electrical parasitics. This is achieved by virtue of the fact that at least two substrates (1, 2) are provided, the substrates (1, 2) are provided substratewise in each case with bonding channels (3, 4) having different dimensions, in a manner forming a multistage bonding channel, the bonding channels (3) in the ball-side substrate (2) having larger dimensions than those in the chip-side substrate (1).

23 Claims, 2 Drawing Sheets

FBGA ARRANGEMENT

This application claims priority to German Patent Application 103 39 770.1, which was filed Aug. 27, 2003 and is incorporated herein by reference.

TECHNICAL FIELD

The present invention relates generally to a packaging of electronic components and more particularly to a fine pitch ball grid array arrangement.

BACKGROUND

According to present-day prior art, SGRAM (synchronous graphics random access memory) products comprise chips with a peripheral arrangement of bonding pads, i.e., bonding pads are arranged along the outer edges of the chip. Also, the products have a housing in traditional face-up technology. This means that the chips are bonded onto a substrate with the active side upward. For electrical contact connection, wire bridges connect the bonding pads on the chip to the contact islands on the substrate on the chip side. The substrate is furthermore provided with soldering balls on the side opposite to the chip, which are connected to the contact islands via a rewiring in the substrate. In order to be able to realize this, multilayer substrates are used. Such packages are also referred to inter alia as an FBGA arrangement (Fine Pitch Ball Grid Array).

Calculations by chip designers have now shown that it is no longer possible to realize the peripheral arrangement of the bonding pads for DDR3 SGRAMS and comparable components owing to the high clock rate of 800 MHz and owing to the signal propagation times. Furthermore, significantly lower signal and supply inductances than according to the present-day standard are required.

In order to prevent these problems, an arrangement of the bonding pads along the chip center axis (center pad row) is required. However, such an arrangement of the bonding pads is difficult to realize in the case of SGRAM products owing to the high number of pads. For example, the number of pads rises to more than 130 in products of this type. This results in the requirement for a new housing technology.

Such a housing technology would have to support the center pad row and at the same time have low electrical parasitics (short signal propagation times, low signal and supply inductance). What is more, a high number of bonding pads must be possible.

The BOC-BSP (board on chip—backside protection, that is to say a chip size package with backside protection) platform technology realized at the present time cannot satisfy these requirements. With the one-layer substrate used hitherto the parasitics cannot be adapted to the required extent.

SUMMARY OF THE INVENTION

In one aspect, the invention relates to an FBGA arrangement, comprising a substrate on which at least one chip is chip-bonded face-down, which has a central row of bonding pads connected to contact islands (landing pads) on the substrate by a bonding channel in the substrate via wire bridges, which substrate, for its part, is provided with soldering balls—arranged in an array—for contact connection to a printed circuit board, and the contact islands and the soldering balls being connected to one another via a rewiring of the substrate. The preferred embodiment provides an FBGA arrangement, which can overcome the disadvantages exhibited in the prior art.

In the case of an FBGA arrangement of the type mentioned in the introduction, the preferred embodiment of the invention achieves advantages by virtue of the fact that at least two substrates are provided. The substrates are provided substratewise in each case with bonding channels having different dimensions, in a manner forming a multi-stage bonding channel. The bonding channels in the ball-side substrate have larger dimensions than those in the chip-side substrate.

Aspects of the invention provide various wire bonding planes, so that the contact density on the substrate side can be increased, i.e., the landing pad pitch can be reduced. From this it is likewise possible to achieve a reduction of the pad pitch on the chip side, so that the chip area can be saved. The formation of a plurality of planes on the substrate side enables a power-optimized distribution of the supply and data lines on the substrate.

For this purpose, each substrate has a Cu wiring, the Cu wirings being connected to one another via plated-through holes.

A number of embodiments and variations can be achieved. For example, in a development of the invention, the bonding channels of the substrates are surrounded by contact islands that are electrically connected to the Cu wirings of the respective substrate.

The substrates can be fixedly connected to one another by lamination.

In a further refinement of the invention, the wire bridges between chip and substrate are in each case alternately connected to a contact island of the different substrate layers. This results in a further advantage of the invention that resides in the fact that the wire bridges have different lengths and the respective shorter wire bridges are significantly more stable and are not moved or are hardly moved during molding. This essentially eliminates the risk of a short circuit.

A particular refinement of the invention is defined by the fact that a multiplicity of substrates 1–n are provided, the dimensions of the bonding channels increasing from the lower chip-side substrate to the ball-side substrate. The substrate pitch can thus be multiplied. In one example, the number n is equal to the maximum number of metalization (e.g., Cu) layers.

Finally, it is possible for the substrate adjacent to the chip, on the chip side, to be provided with an additional Cu layer that is electrically connected to the rest of the Cu wiring via the plated-through holes. This additional Cu layer may form a further supply plane and/or be utilized for signal lines.

BRIEF DESCRIPTION OF THE DRAWINGS

The invention will be explained in more detail below using an exemplary embodiment. In the associated drawings.

DETAILED DESCRIPTION OF ILLUSTRATIVE EMBODIMENTS

As can be seen from the associated figures of the drawings, embodiments of the invention comprise the construction of a two-layered substrate 1, 2 for BOC-BSP technology with the special feature that bonding channels 3, 4 are provided in the substrates 1, 2, which have a different geometry.

Figure 1:
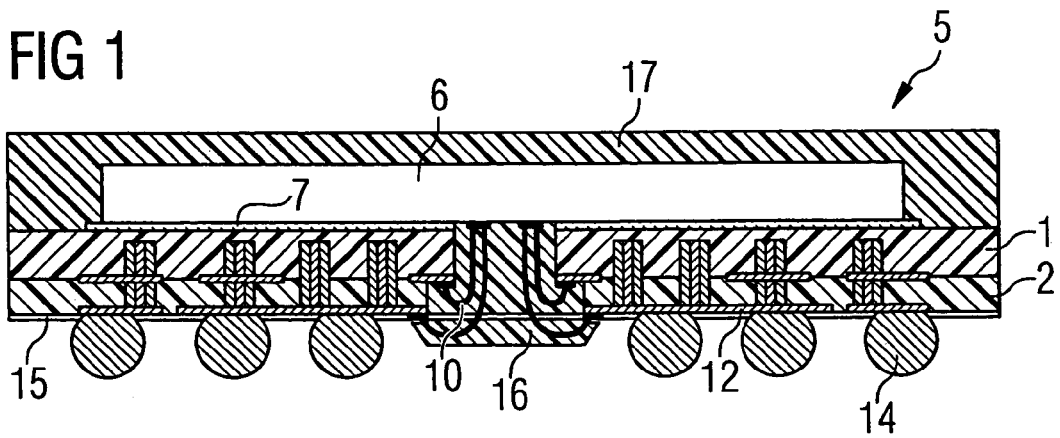
FIG. 1 shows a sectional illustration of an FBGA arrangement according to the invention with a two-plane substrate.
Figure 2:
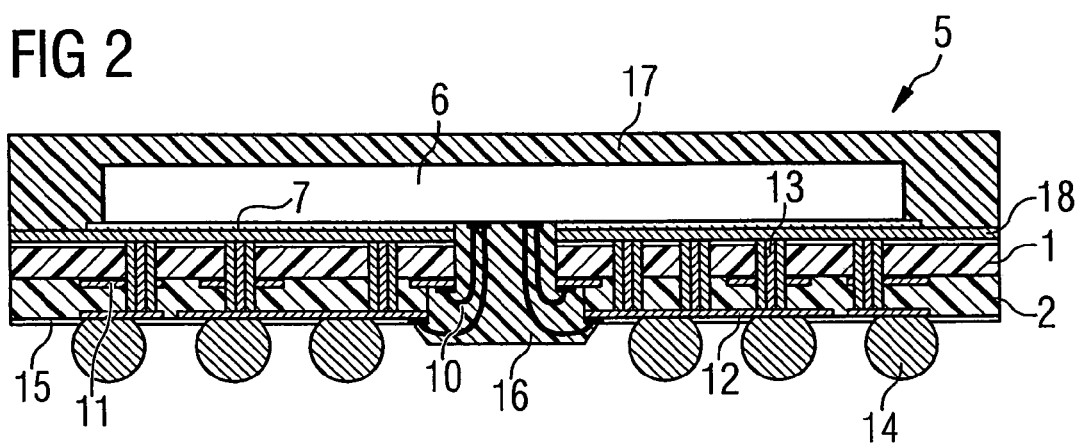
FIG. 2 shows an FBGA substrate according to FIG. 1 that further includes a third metal plane.
Figure 3:
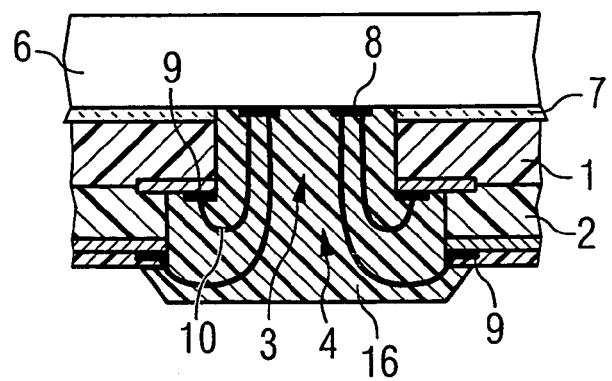
FIG. 3 shows an enlarged detail from FIG. 1.

FIGS. 1 through 3 show an FBGA arrangement 5, in which a chip 6 is bonded face-down on two substrates 1, 2—laminated on one another—with the interposition of a tape 7 in such a way that the bonding pads 8 lie in a center row arrangement above the bonding channels 3, 4.

The bonding channel 3 of the lower chip-side substrate 1 is made narrower than the bonding channel 4 of the upper ball-side substrate 2 thereby producing a step. Contact islands (landing pads) 9 are in each case arranged at the edge of each bonding channel 3, 4, and are in each case electrically connected via wire bridges 10 to the bonding pads 8 on the chip 6.

By virtue of the bonding channel being formed in stepped fashion according to the invention, which bonding channel comprises the bonding channels 3, 4 lying one above the other, it is possible for each layer to be bonded individually.

The substrates 1, 2 are respectively provided with metal (e.g., Cu) wirings (Cu trace) 11, 12, which are connected via plated-through holes 13 among one another and to soldering balls 14. Finally, a soldering resist 15 is situated on the outer side of the upper ball-side substrate 2 between the soldering balls 14 and a potting composition 16 for protecting the wire bridges 10 is situated in the bonding channels 3, 4.

The backside protection of the chip 6 is realized by means of a molding compound 17. The backside protection is optional and need not be used if not desired.

The distribution of the contact islands 9 between two planes effectively doubles the pad pitch on the chip 6. By contrast, the pad width on the substrate according to the prior art is a limiting factor for the bonding pad pitch on the chip. This bonding pad pitch can effectively be doubled or multiplied, if appropriate, by virtue of the invention.

A further advantage is that the two-layered construction of the substrates 1, 2 permits a disentanglement of the data lines and the supply lines. Thus, it is possible, e.g., to construct a plane only for supply lines. Supply parasitics are thereby considerably reduced. In addition to the supply plane, further contributions to reducing the inductances are made possible by wider interconnects of the Cu wiring 11, 12 and by a shorter line routing.

The latter advantages can also be extended to signal lines. First simulations show a reduction factor of approximately three, compared with the inductances that are achieved by means of the BOC technology available from the prior art. The other plane can be utilized for data signals mixed with further supply lines.

The constitution of the substrates 1, 2 for BOC technology even makes it possible to construct a third metal (e.g., Cu) layer 18 whilst retaining the two-layer substrate, as shown in FIG. 2. The third Cu layer 18 may be realized on the chip side of the lower substrate 1, which is present anyway in the production process and is removed and not contact-connected in the case of the present-day status according to the prior art.

Since, in the case of the solution according to the invention, contact holes (via holes) are present for the plated-through holes 13, the third Cu layer can also be contact-connected without any additional outlay.

The third Cu layer 18 may form a further supply plane and/or be utilized for signal lines.

The substrate production process will be explained below with reference to FIGS. 4–6. These figures show a process that provides for the simultaneous manufacture of six substrates, which can be singulated subsequent to lamination. Other numbers of substrates can be formed together.

In principle, there are at least two possibilities for producing the two-layer substrate from the chip-side lower substrate 1 and the ball-side upper substrate 2. The simplest possibility would be to provide the substrates 1 (FIG. 4) and 2 (FIG. 5) in each case with the bonding channel 3, 4 having the required size and then to laminate them. However, the soldering resist and electrodeposition process is difficult to handle in this case.

Another possibility is to provide the ball-side substrate 2 with wide bonding channels 3 (FIG. 5) and then to laminate this substrate 2 onto the unformed chip-side substrate 1. The narrow bonding channels 4 are subsequently worked into the chip-side substrate 1 (FIG. 6). Finally, it is then also necessary to bore the contact holes, to electroplate the contact holes in order to produce the plated-through holes and to apply the soldering resist.

In principle, it is also possible to provide more than two substrates. In the design, it is then necessary to provide a sufficient depopulation of the ball matrix in order to support the then overall larger bonding channel widths. This means that in the case of a rising number of substrate layers with increasing bonding channel widths, the number of depopulated rows must increase. With these multilayer substrates as well, the number of possible copper layers is n or n+1, where n denotes the number of substrate layers.

Figure 4:
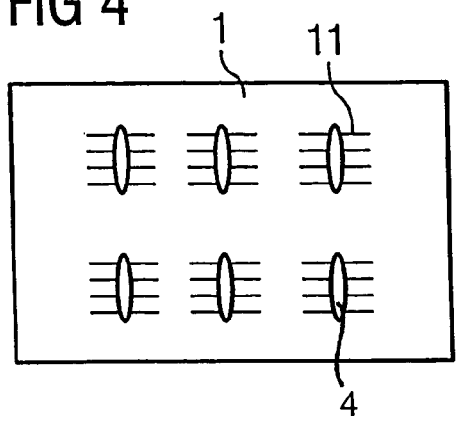
FIG. 4 shows a substrate of the second plane that is provided with interconnects.
Figure 5:
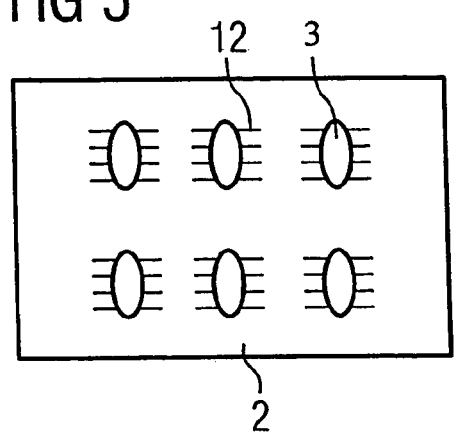
FIG. 5 shows a substrate of the first plane that is provided with bonding channels and interconnects.
Figure 6:
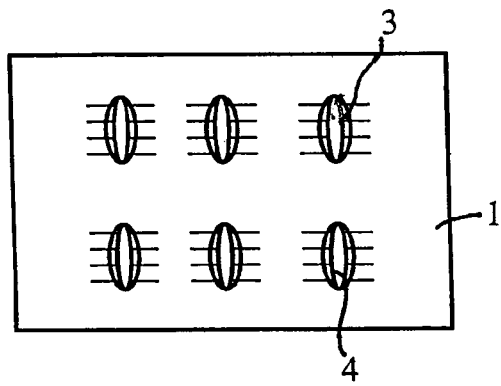
FIG. 6 shows the plan view of the substrates of the first and the second plane that are laminated on one another.

As can be seen from FIGS. 4 to 6, the substrates 1, 2, for manufacturing and cost reasons are provided for in this case 6 chips respectively, a singulation to form FBGA arrangements being effected after complete mounting.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An electronic component, comprising:
   a substrate including a bonding channel having a stepped configuration extending through the substrate, the substrate having a plurality of soldering balls disposed on a bottom surface, the substrate having a plurality of contact islands adjacent the bonding channel, wherein some of the contact islands are arranged in a first plane and others of the contact islands are arranged in a second plane, the first plane being parallel to and spaced from the second plane;
   a chip having a central row of bond pads on an upper surface, the upper surface of the chip being attached to a top surface of the substrate such that the central row of bond pads are aligned inside the bonding channel of the substrate, the top surface of the substrate being opposite the bottom surface of the substrate; and a plurality of wire bridges electrically coupling the bond pads of the chip to the contact islands of the substrate, the wire bridges extending through the bonding channel.

2. The electronic component as claimed in claim 1, wherein the substrate comprises at least two substrates, wherein the two substrates each include a bonding channel of a different dimension, the two substrates being aligned in a manner forming a multistage bonding channel.

3. The electronic component as claimed in claim 2, wherein the bonding channel of a first one of the two substrates that is arranged further from the chip has a larger dimension than a dimension of the second of the two substrates.

4. The electronic component as claimed in claim 2, wherein the two substrates are fixedly connected to one another by lamination.

5. The electronic component as claimed in claim 2, wherein the substrate includes at least three substrates, the dimensions of the bonding channels of each substrate increasing as each substrate is arranged farther from the chip.

6. The electronic component as claimed in claim 1, wherein the substrate includes a plurality of metal wirings, the metal wirings being electrically connected to one another via plated-through holes.

7. The electronic component as claimed in claim 5, wherein the metal wirings comprise copper wirings.

8. The electronic component as claimed in claim 5, wherein the contact islands arranged in the first plane are formed in one of the metal wirings and the contact islands arranged in the second plane are formed in another of the metal wirings.

9. The electronic component as claimed in claim 1, wherein adjacent ones of the wire bridges are in each case alternately coupled to a contact island located in the first or second planes.

10. An electronic component, comprising:
a substrate including a bonding channel having a stepped configuration extending through the substrate, the substrate having a plurality of contact islands adjacent the bonding channel, wherein some of the contact islands are arranged in a first plane and others of the contact islands are arranged in a second plane, the first plane being parallel to and spaced from the second plane;
a chip having a central row of bond pads on an upper surface; and
a plurality of wire bridges electrically coupling the bond pads of the chip to the contact islands of the substrate, the wire bridges extending through the bonding channel;
wherein a surface that is provided with a plurality of soldering balls arranged in an array, ones of the contact islands and ones of the soldering balls being electrically connected to one another via a rewiring of the substrate.

11. An electronic component, comprising:
a substrate including a bonding channel having a stepped configuration extending through the substrate, the substrate having a plurality of contact islands adjacent the bonding channel, wherein some of the contact islands are arranged in a first plane and others of the contact islands are arranged in a second plane, the first plane being parallel to and spaced from the second plane;
a chip having a central row of bond pads on an upper surface; and
a plurality of wire bridges electrically coupling the bond pads of the chip to the contact islands of the substrate, the wire bridges extending through the bonding channel;
wherein the substrate is provided with an additional conductive layer on a surface adjacent to the chip.

12. The electronic component as claimed in claim 11, wherein the additional conductive layer comprises a copper layer that is electrically connected to a copper wiring in the substrate via plated-through holes.

13. An FBGA arrangement, comprising a substrate on which at least one chip is chip-bonded face-down, the chip having a central row of bonding pads coupled to contact islands on the substrate by a bonding channel in the substrate via wire bridges, the substrate further including soldering balls arranged in an array for electrical connection to a printed circuit board, the contact islands and the soldering balls being electrically connected to one another via a rewiring of the substrate, wherein the substrate comprises at least two substrates arranged one on top of the other with bonding channels having different dimensions, in a manner forming a multistage bonding channel, the bonding channels in a ball-side substrate having larger dimensions than those in a chip-side substrate.

14. The FBGA arrangement as claimed in claim 13, wherein each substrate has a Cu wiring, the Cu wirings being coupled to one another via plated-through holes.

15. The FRGA arrangement as claimed in claim 13, wherein the bonding channels of the substrates are surrounded by contact islands that are electrically connected to the Cu wirings of the respective substrate.

16. The FBGA arrangement as claimed in claim 13, wherein the substrates are fixedly connected to one another by lamination.

17. The FBGA arrangement as claimed in claim 13, wherein the wire bridges are in each ease alternately connected to a contact island of the ball-side substrate or the chip-side substrate.

18. The FBGA arrangement as claimed in claim 13, wherein at least three substrates are provided, the dimensions of the bonding channels increasing proceeding from the chip-side substrate to the ball-side substrate.

19. The FBGA arrangement as claimed in claim 13, wherein a chip-side surface of a substrate closest to the chip is provided with an additional Cu layer that is electrically connected to the rest of the Cu wiring via plated-through holes.

20. A method of forming an electronic component, the method comprising:
providing a first substrate;
providing a second substrate;
forming a combined substrate by laminating the first substrate and the second substrate, the combined substrate including a bonding channel with a stepped configuration, wherein forming a combined substrate further comprises laminating a third substrate with the first and second substrates;
securing a chip to the combined substrate such that bonding pads on the chip are aligned with the bonding channel of the combined substrate;
electrically coupling some of the bonding pads of the chip to contact islands on the first substrate and others of the bonding pads of the chip to contact islands on the second substrate; and
electrically coupling yet others of the bonding pads of the chip to contact islands on the third substrate.

21. A method of forming an electronic component, the method comprising:
- providing a first substrate having a first bonding channel extending there through;
- laminating the first substrate to a second substrate;
- after laminating, forming a second bonding channel in the second substrate, the second bonding being narrower than the first bonding channel;
- securing a chip to the first substrate such that bonding pads on the chip are aligned with the first and second bonding channels; and
- electrically coupling some of the bonding pads of the chip to contact islands on the first substrate and others of the bonding pads of the chip to contact islands on the second substrate.

22. The method of claim 21 and further comprising boring contact holes to provide for electrical coupling of wirings on the first substrate to wirings on the second substrate.

23. The method of claim 21 wherein providing a first substrate comprises providing a first substrate having a bonding channel of a first dimension and wherein providing a second substrate comprises providing a second substrate having a bonding channel of a second dimension.

* * * * *

UNITED STATES PATENT AND TRADEMARK OFFICE
CERTIFICATE OF CORRECTION

| | |
|---|---|
| PATENT NO. | : 7,023,097 B2 |
| APPLICATION NO. | : 10/927952 |
| DATED | : April 4, 2006 |
| INVENTOR(S) | : Thomas et al. |

Page 1 of 1

It is certified that error appears in the above-identified patent and that said Letters Patent is hereby corrected as shown below:

Column 6, line 28: delete "FRGA" and insert --FBGA--.

Column 6, line 36: delete "ease" and insert --case--.

Column 8, line 6: delete "21" and insert --20--.

Signed and Sealed this

Eleventh Day of July, 2006

JON W. DUDAS
*Director of the United States Patent and Trademark Office*